(12) United States Patent
Wu et al.

(10) Patent No.: US 8,648,407 B2
(45) Date of Patent: Feb. 11, 2014

(54) SEMICONDUCTOR DEVICE AND METHOD FOR FABRICATING THEREOF

(75) Inventors: Tieh-Chiang Wu, Taoyuan County (TW); Chin-Ling Huang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 98 days.

(21) Appl. No.: 13/350,767

(22) Filed: Jan. 14, 2012

(65) Prior Publication Data

US 2013/0181277 A1 Jul. 18, 2013

(51) Int. Cl.
*H01L 21/8234* (2006.01)
*H01L 29/792* (2006.01)

(52) U.S. Cl.
USPC .......................................... 257/324; 438/275

(58) Field of Classification Search
USPC .......................................... 257/324; 438/275
See application file for complete search history.

(56) References Cited

U.S. PATENT DOCUMENTS

| 6,617,662 | B2 | 9/2003 | Park | |
|---|---|---|---|---|
| 7,659,159 | B2 * | 2/2010 | Lee | 438/210 |
| 7,666,742 | B2 * | 2/2010 | Kim et al. | 438/270 |
| 2005/0189582 | A1 * | 9/2005 | Mikolajick | 257/324 |
| 2006/0108646 | A1 * | 5/2006 | Hofmann et al. | 257/390 |
| 2007/0045717 | A1 * | 3/2007 | Parascandola et al. | 257/324 |
| 2008/0166856 | A1 * | 7/2008 | Parekh et al. | 438/435 |
| 2010/0006975 | A1 * | 1/2010 | Ang | 257/510 |
| 2012/0211813 | A1 * | 8/2012 | Taketani | 257/296 |

* cited by examiner

*Primary Examiner* — Matthew Landau
*Assistant Examiner* — Igwe U Anya

(57) ABSTRACT

A semiconductor device includes a semiconductor substrate having a first opening and a second opening adjacent thereto. A first dielectric layer is disposed in a lower portion of the first opening. A charge-trapping dielectric layer is disposed in an upper portion of the first opening to cover the first dielectric layer. A doping region of a predetermined conductivity type is formed in the semiconductor substrate adjacent to the first opening and the second opening, wherein the doping region of the predetermined conductivity type has a polarity which is different from that of the charges trapped in the charge-trapping dielectric layer. A gate electrode is disposed in a lower portion of the second opening. A method for fabricating the semiconductor device is also disclosed.

18 Claims, 7 Drawing Sheets

SEMICONDUCTOR DEVICE AND METHOD FOR FABRICATING THEREOF

BACKGROUND OF THE INVENTION

1. Field of the Invention

The invention relates to a semiconductor device and more particularly to a semiconductor device with improved electrical characteristics and a method for fabricating thereof.

2. Description of the Related Art

With the wide application of integrated circuits (ICs), several kinds of semiconductor devices with higher efficiencies and lower costs have been produced based on different objectives. The memory device, such as a dynamic random access memory (DRAM), is such an important semiconductor device in the electronics industry. Typically, one DRAM cell includes one transistor and one capacitor. In order to increase the memory device integration, it is required to shrink the size of the memory cell and the transistor so as to manufacture the DRAM with higher memory capacity and higher processing speed.

A traditional DRAM with a plane transistor covers large areas of the semiconductor substrate and cannot satisfy the demand of high integration. Therefore, a vertical transistor which can save space is a trend in the fabrication of a memory cell.

FIG. 1 is a cross section of a conventional vertical transistor for a memory cell with a buried word line (WL). The transistor 10 includes a semiconductor substrate 102 having an opening 100a therein. Doping regions 102 are formed on both sides of the opening 100a to serve as source/drain regions of the transistor 10. A gate electrode 104 is disposed in the bottom of the opening 100a and is referred to as a buried WL. A gate dielectric layer 106 is interposed between the opening 100a and the gate electrode 104. A cap oxide 108 is formed in the opening 100a to cover the gate electrode 104.

However, the top corners C of the gate electrode 104 adjacent to the doping regions 102 may induce electric field concentration, resulting in an enhancement of gate induced drain leakage (GIDL). The increased GIDL is not desired because it reduces the reliability of the transistor 10.

Accordingly, there is a need to develop a novel semiconductor device which is capable of mitigating or eliminating the aforementioned problem.

BRIEF SUMMARY OF THE INVENTION

An exemplary embodiment of a semiconductor device comprises a semiconductor substrate having a first opening and a second opening adjacent thereto. A first dielectric layer is disposed in a lower portion of the first opening. A charge-trapping dielectric layer is disposed in an upper portion of the first opening to cover the first dielectric layer. A doping region of a predetermined conductivity type is formed in the semiconductor substrate adjacent to the first opening and the second opening, wherein the doping region of the predetermined conductivity type has a polarity which is different from that of the charges trapped in the charge-trapping dielectric layer. A gate electrode is disposed in a lower portion of the second opening.

An exemplary embodiment of a method for fabricating a semiconductor device comprises providing a semiconductor substrate having a first opening therein. A first dielectric layer is formed in a lower portion of the first opening. A charge-trapping dielectric layer is formed in an upper portion of the first opening to cover the first dielectric layer. A second opening is formed in the semiconductor substrate adjacent to the first opening. A gate electrode is formed in a lower portion of the second opening. A doping region of a predetermined conductivity type is formed in the semiconductor substrate adjacent to the first opening and the second opening, wherein the doping region of the predetermined conductivity type has a polarity which is different from that of the charges trapped in the charge-trapping dielectric layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
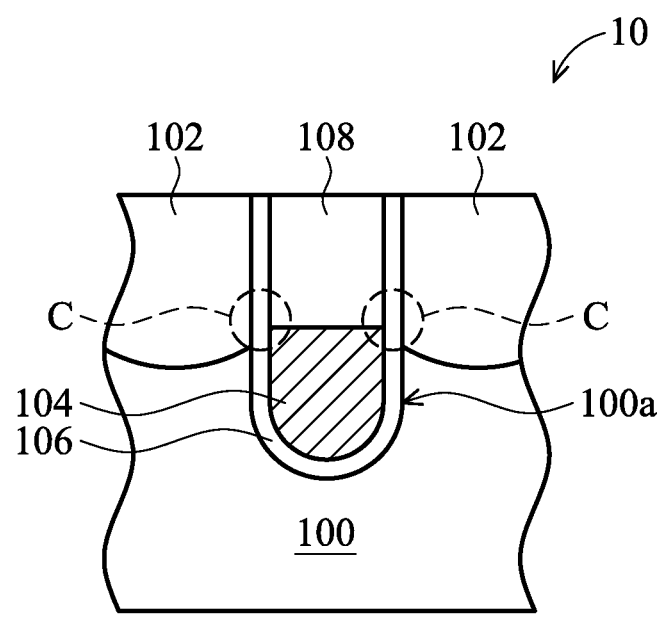
FIG. 1 is a cross section of a conventional vertical transistor for a memory cell with a buried WL.

The following description encompasses the fabrication process and the purpose of the invention. It can be understood that this description is provided for the purpose of illustrating the fabrication process and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Figure 2A:
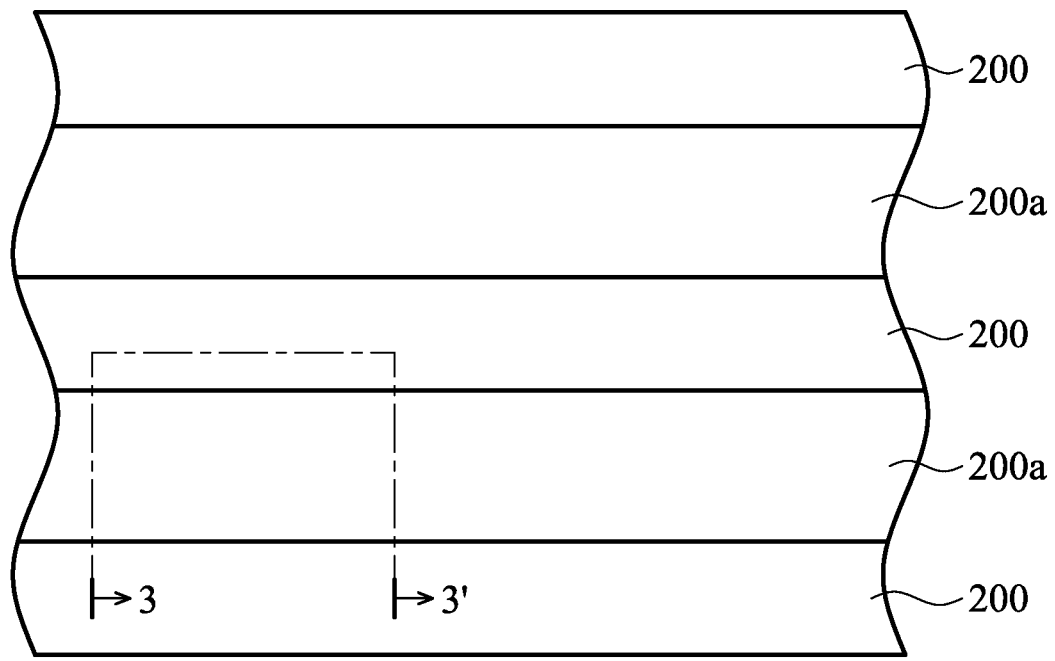
FIGS. 2A to 2E are plan views of an embodiment of a method for fabricating a semiconductor device according to the invention.
Figure 2B:
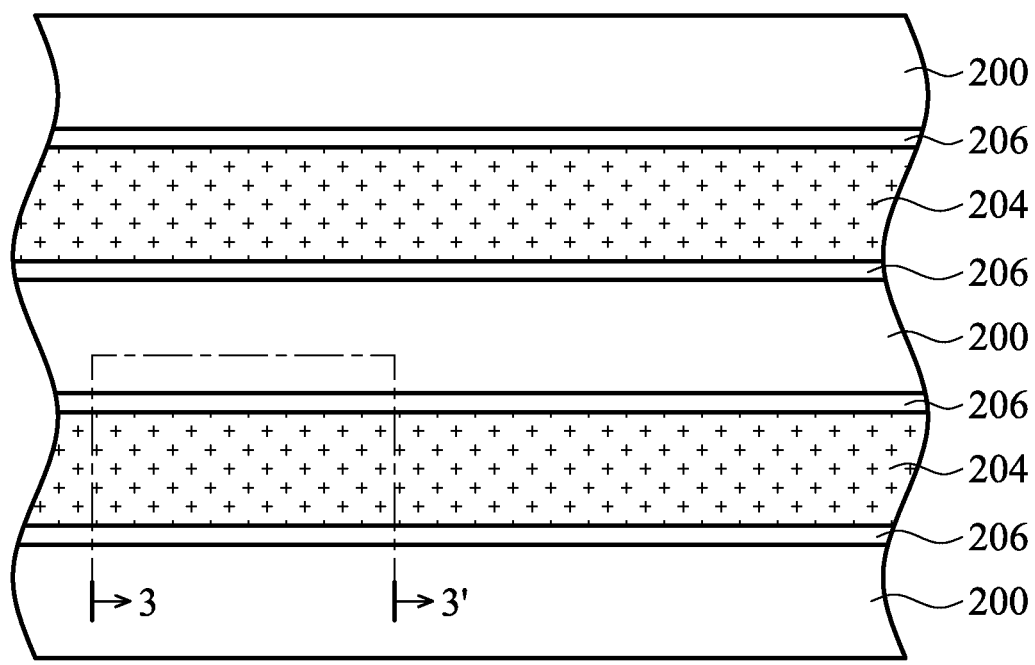
Figure 2C:
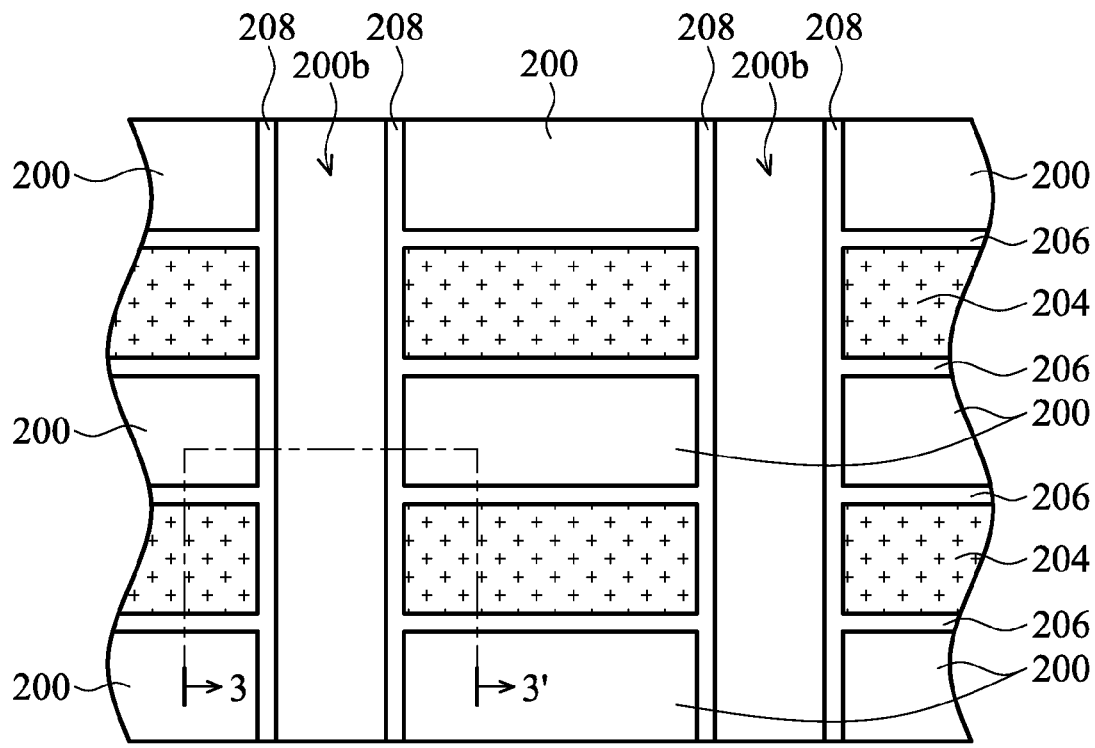
Figure 2D:
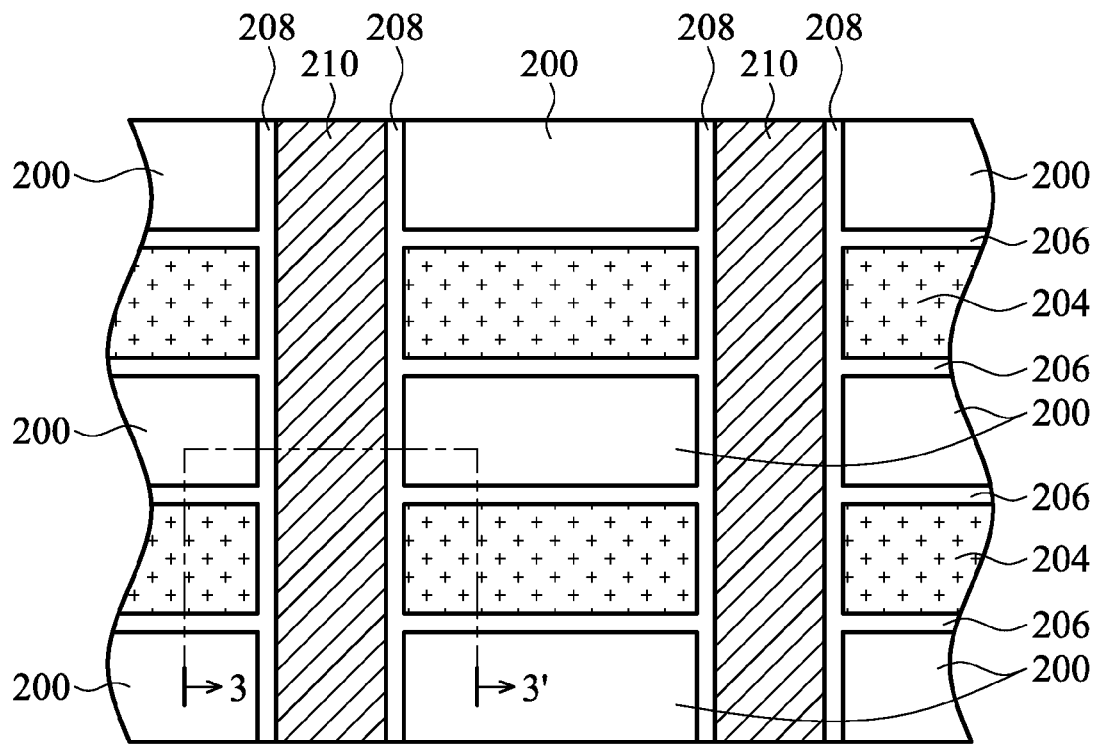
Figure 2E:
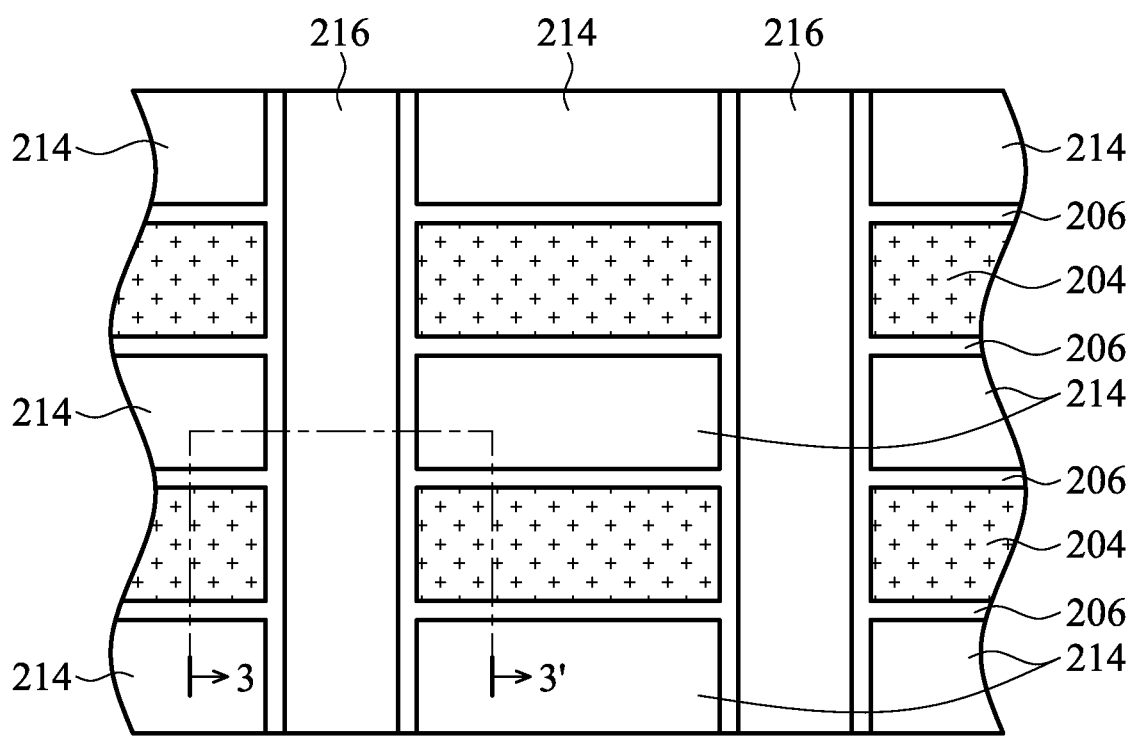
Figure 3A:
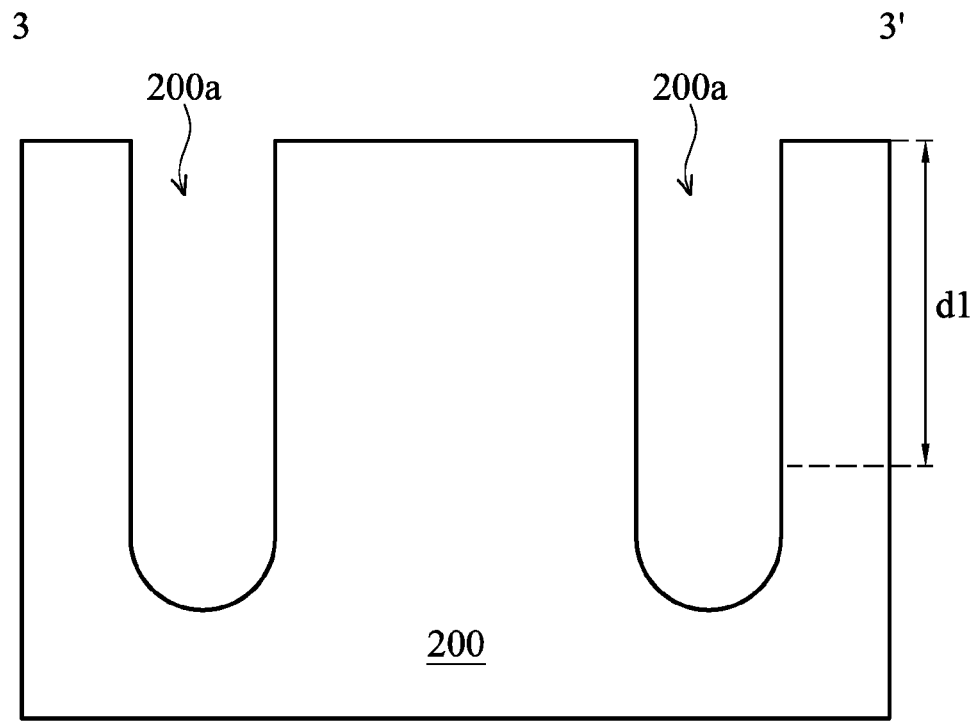
FIGS. 3A to 3E are cross sections along 3-3' line shown in FIGS. 2A to 2E.
Figure 3B:
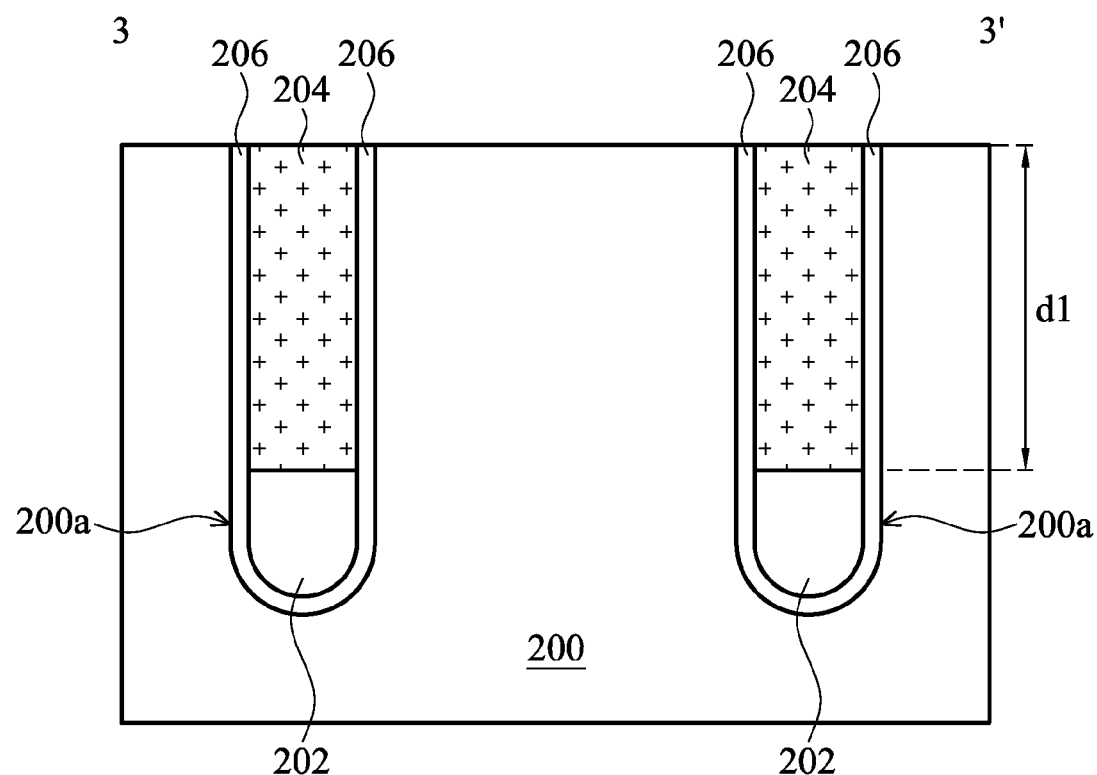
Figure 3C:
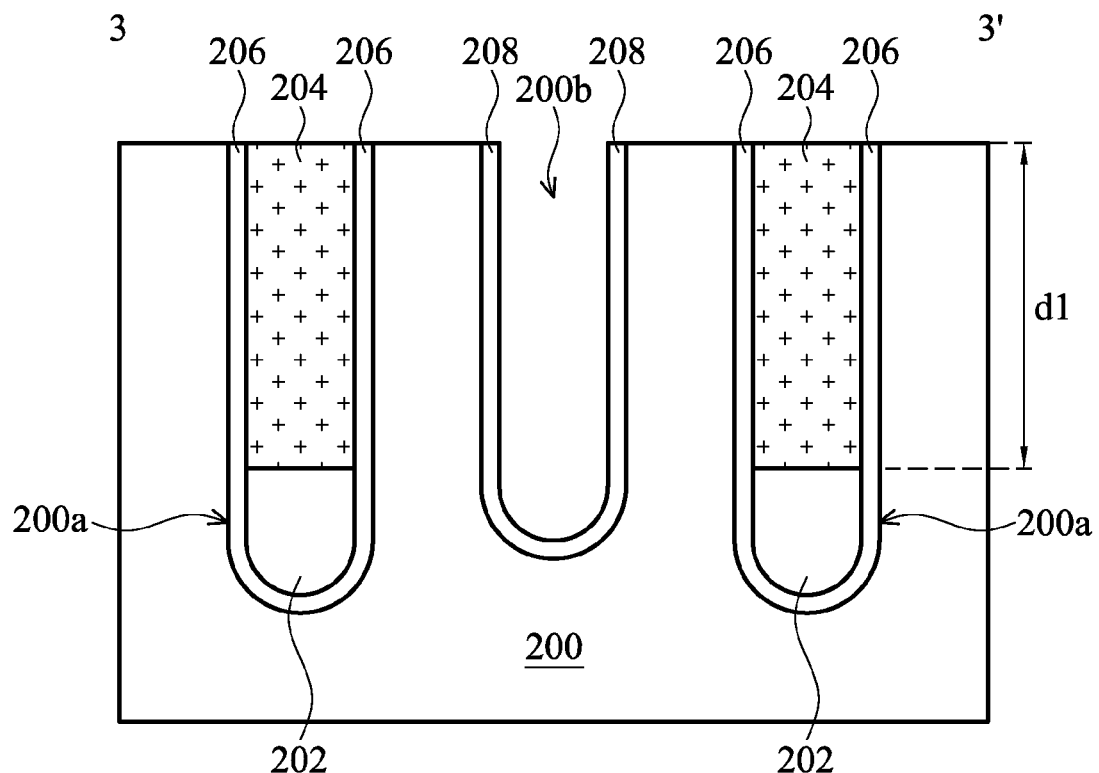
Figure 3D:
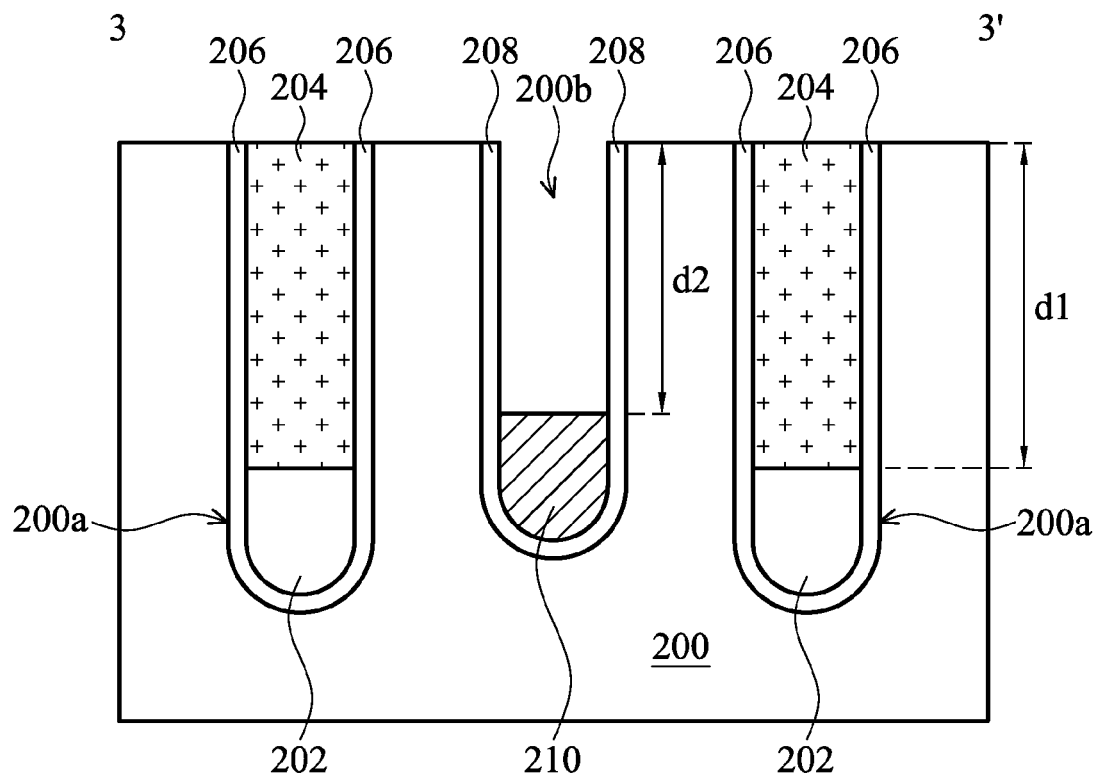
Figure 3E:
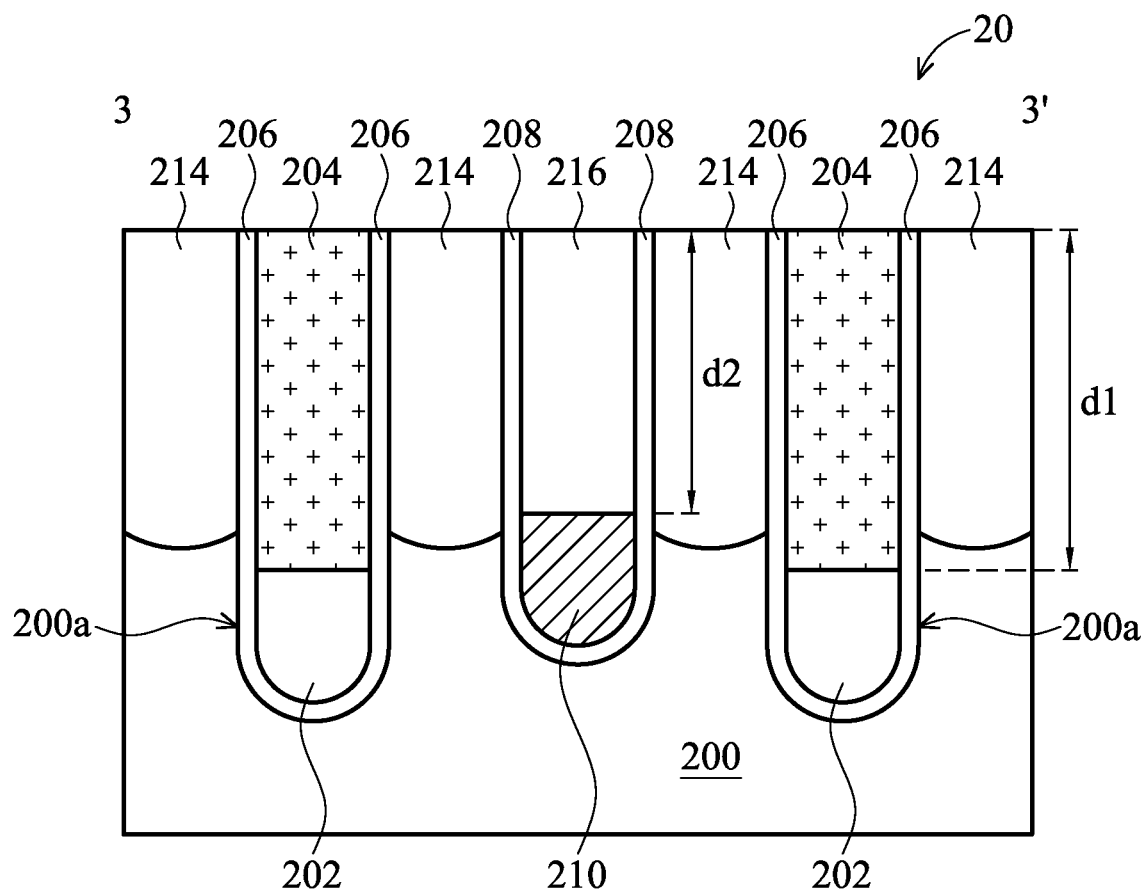

Referring to FIGS. 2E and 3E, which respectively illustrate a plan view of an exemplary embodiment of a semiconductor device 20 according to the invention and a cross section along 3-3' line in FIG. 2E. In the embodiment, the semiconductor device 20 includes a vertical transistor and may be implemented in a semiconductor memory device, such as a DRAM. The semiconductor device 20 comprises a semiconductor substrate 200. The semiconductor substrate 200 may comprise silicon, silicon germanium, gallium arsenic or other semiconductor material. In the embodiment, the semiconductor substrate 200 has at least one first opening 200a and at least one second opening 200b adjacent to the first opening 200a. The first and second openings 200a and 200b may be deep trenches with different depths formed in the semiconductor substrate 200, in which the first opening 200a is used for forming an isolation structure (e.g., a shallow trench isolation (STI) structure) and defining active areas (not shown) in the semiconductor substrate 200. Moreover, the second opening 200b is used for formation of a vertical transistor of the semiconductor device 20.

A first dielectric layer 202 is disposed in a lower portion of the first opening 200a. Moreover, a charge-trapping dielectric layer 204 is disposed in an upper portion of the first opening 200a, such that the first dielectric layer 202 is covered by the charge-trapping dielectric layer 204. Additionally, a liner insulating layer 206 is conformably disposed in the first opening 200a and is interposed between the lower portion of the first opening 200a and the first dielectric layer 202 and between the upper portion of the first opening 200a and the charge-trapping dielectric layer 204. In the embodiment, the first dielectric layer 202 in the first opening 200a and the charge-trapping dielectric layer 204 thereon constitute the isolation structure. Moreover, the first dielectric layer 202 may comprise silicon oxide. The charge-trapping dielectric layer 204 comprises a material which is different from that of the first dielectric layer 202 and is dependant upon the conductivity type of the vertical transistor.

The vertical transistor is disposed in the semiconductor substrate 200 adjacent to the isolation structure. In one embodiment, the vertical transistor may comprise a gate electrode 210, doping regions 214 serving as source/drain regions, a gate dielectric layer 208 and a second dielectric layer 216.

In one embodiment, the gate electrode 210, such as a doped polysilicon or metal, is disposed in a lower portion of the second opening 200b and may serve as a buried WL for the semiconductor memory device. The doping regions 214 are disposed in the semiconductor substrate 200 on both sides of the second opening 200b, such that one of the doping regions 214 is adjacent to the first and second openings 200a and 200b. The doping region 214 has a predetermined conductivity type (i.e., n-type or p-type). The gate dielectric layer 208 is interposed between the gate electrode 210 and the doping regions 214. Moreover, the second dielectric layer 216 is disposed in an upper portion of the second opening 200b to serve as a cap protection layer, such that the gate electrode 210 is covered by the second dielectric layer 216.

Particularly, in the vertical transistor, each doping region 214 of the predetermined conductivity type has a polarity which is different from that of the charges (not shown) trapped in the charge-trapping dielectric layer 204. In one embodiment, the predetermined conductivity type is n-type (i.e., the polarity of the doping 214 is negative). In this case, the polarity of the charges trapped in the charge-trapping dielectric layer 204 is positive, and the charge-trapping dielectric layer 204 may comprise silicon nitride. In another embodiment, the predetermined conductivity type is p-type (i.e., the polarity of the doping 214 is positive). In this case, the polarity of the charges trapped in the charge-trapping dielectric layer 204 is negative. As a result, the effect of electric field concentration at the top corners of the gate electrode 210 adjacent to the doping regions 214 can be suppressed by the charges trapped in the charge-trapping dielectric layer 204, such that the GIDL caused by a high electric field in the drain junction of the vertical transistor can be mitigated or eliminated. In the embodiment, a bottom surface edge of the charge-trapping dielectric layer 204 close to the liner insulating layer 206 is lower than an top surface edge of the gate electrode 210 close to the liner insulating layer 206, thereby further suppressing the high electric field effect at the top corners of the gate electrode 210 adjacent to the doping regions 214.

Referring to FIGS. 2A to 2E and FIGS. 3A to 3E, in which FIGS. 2A to 2E are plan views of an embodiment of a method for fabricating a semiconductor device according to the invention and FIGS. 3A to 3E are cross sections along 3-3' line shown in FIGS. 2A to 2E. In FIGS. 2A and 3A, a semiconductor substrate 200 is provided. In the embodiment, the semiconductor substrate 200 may comprise silicon, silicon germanium, gallium arsenic or other semiconductor material. The semiconductor substrate 200 has first openings 200a therein. The first openings 200a may be deep trenches and is used for forming an isolation structure (e.g., a STI structure) and defining active areas (not shown) in the semiconductor substrate 200.

In FIGS. 2B and 3B, a liner insulating layer 206 is conformably formed on a sidewall and a bottom of each first opening 200a by a conventional deposition process, such as CVD or thermal oxidation. A first dielectric layer 202 is formed in a lower portion of each first opening 200a, such that the liner insulating layer 206 is interposed between the lower portion of the first opening 200a and the first dielectric layer 202. In one embodiment, the first dielectric layer 202 may comprise silicon oxide and be formed by, for example, chemical vapor deposition (CVD), low pressure chemical vapor deposition (LPCVD), plasma enhanced chemical vapor deposition (PECVD), high density plasma chemical vapor deposition (HDPCVD), spin coating or other deposition processes well known in the art. After the deposition of the first dielectric layer 202, a planarization process (such as a chemical mechanical polishing (CMP) process) and an etch back process (such as a dry or wet etching process) are subsequently performed, such that the first dielectric layer 202 is recessed to a depth d1 from an upper surface of the semiconductor substrate 200, to expose an upper portion of the each first opening 200a. Thereafter, a charge-trapping dielectric layer 204 is formed in the exposed upper portion of each first opening 200a, such that the first dielectric layer 202 is covered by the charge-trapping dielectric layer 204, and the liner insulating layer 206 is interposed between the upper portion of the first opening 200a and the charge-trapping dielectric layer 204. In the embodiment, the first dielectric layer 202 and the overlying charge-trapping dielectric layer 204 in the first opening 200a constitute the isolation structure. Also, the charge-trapping dielectric layer 204 may be formed by the same or similar method as that of the first dielectric layer 202. Note that the charge-trapping dielectric layer 204 comprises a material which is different from that of the first dielectric layer 202 and is dependant upon the conductivity type of the vertical transistor.

In FIGS. 2C and 3C, second openings 200b are formed in the semiconductor substrate 200 and are adjacent to the first openings 200a, as shown in FIG. 2C. The second openings 200b are used for formation of vertical transistors. Next, a liner insulating layer 208, such as silicon oxide, is formed on a sidewall and a bottom of each second opening 200b by a conventional deposition process, such as CVD or thermal oxidation. The liner insulating layer 208 serves as a gate dielectric layer of the vertical transistor.

In FIGS. 2D and 3D, a gate electrode 210 of the vertical transistor is formed in a lower portion of each second opening 200b. In one embodiment, the gate electrode 210 may comprise doped polysilicon or metal, and be formed by, for example, CVD or other deposition processes well known in the art. After the deposition of the gate electrode 210, a planarization process (such as a CMP process) and an etch back process (such as a dry or wet etching process) are subsequently performed, such that the gate electrode 210 is recessed to a depth d2 from the upper surface of the semiconductor substrate 200, to expose an upper portion of the each second opening 200b. In one embodiment, the recess depth d2 of the gate electrode 210 is less than the recess depth d1 of the first dielectric layer 202, such that a bottom surface edge of the charge-trapping dielectric layer 204 is lower than a top surface edge of the gate electrode 210.

In FIGS. 2E and 3E, a doping process, such as an ion implantation process or thermal diffusion, is performed in the active areas of the semiconductor substrate 200 (i.e., the semiconductor substrate 200 on both sides of each second opening 200b), thereby forming doping regions 214 adjacent to the first and second openings 200a and 200b, such that the gate dielectric layer 208 is interposed between the gate electrode 210 and the doping regions 214. The doping regions 214 serve as source/drain of vertical transistors. Each doping region 214 has a predetermined conductivity type (i.e., n-type or p-type).

Particularly, in each vertical transistor, the doping region 214 of the predetermined conductivity type has a polarity which is different from that of the charges (not shown) trapped in the charge-trapping dielectric layer 204. In one embodiment, the predetermined conductivity type is n-type (i.e., the polarity of the doping 214 is negative). In this case, the polarity of the charges trapped in the charge-trapping dielectric layer 204 is positive, and the charge-trapping dielectric layer 204 may comprise silicon nitride. In another embodiment, the predetermined conductivity type is p-type (i.e., the polarity of the doping 214 is positive). In this case, the polarity of the charges trapped in the charge-trapping dielectric layer 204 is negative.

After formation of doping regions 214, a second dielectric layer 216 is formed in an upper portion of the second opening 200b to serve as a cap protection layer, such that the gate electrode 210 is covered by the second dielectric layer 216. The second dielectric layer 216 may comprise a material which is the same as or which is different from that of the first dielectric layer 202 or that of the charge-trapping dielectric layer 204, and be formed by, for example, CVD, which completes the description of a semiconductor device 20 of the invention.

According to the foregoing embodiments, since the effect of electric field concentration at the top corners of the gate electrode 210 adjacent to the doping regions 214 can be suppressed by the charges trapped in the charge-trapping dielectric layer 204, the GIDL caused by a high electric field in the drain junction of the vertical transistor can be mitigated or eliminated. Accordingly, the reliability of the vertical transistors in the semiconductor device 20 can be maintained, thereby increasing the performance of the semiconductor memory device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a semiconductor substrate having a first opening and a second opening adjacent thereto;
    a first dielectric layer, disposed in a lower portion of the first opening;
    a charge-trapping dielectric layer, disposed in an upper portion of the first opening to cover the first dielectric layer;
    a doping region of a predetermined conductivity type, formed in the semiconductor substrate adjacent to the first opening and the second opening, wherein the doping region of the predetermined conductivity type has a polarity which is different from that of the charges trapped in the charge-trapping dielectric layer;
    a gate electrode, disposed in a lower portion of the second opening; and
    a liner insulating layer interposed between the lower portion of the first opening and the first dielectric layer and between the upper portion of the first opening and the charge-trapping dielectric layer.

2. The semiconductor device of claim 1, wherein a bottom surface edge of the charge-trapping dielectric layer is lower than a top surface edge of the gate electrode.

3. The semiconductor device of claim 1, wherein the predetermined conductivity type is n-type.

4. The semiconductor device of claim 3, wherein the polarity of the charges trapped in the charge-trapping dielectric layer is positive.

5. The semiconductor device of claim 3, wherein the charge-trapping dielectric layer comprises silicon nitride.

6. The semiconductor device of claim 1, wherein the first dielectric layer comprises silicon oxide.

7. The semiconductor device of claim 1, wherein the predetermined conductivity type is p-type.

8. The semiconductor device of claim 7, wherein the polarity of the charges trapped in the charge-trapping dielectric layer is negative.

9. The semiconductor device of claim 1, further comprising:
    a second dielectric layer, disposed in an upper portion of the second opening to cover the gate electrode; and
    a gate dielectric layer, interposed between the gate electrode and the doping region of the predetermined conductivity type.

10. A method for fabricating a semiconductor device, comprising:
    providing a semiconductor substrate having a first opening therein;
    forming a first dielectric layer in a lower portion of the first opening;
    forming a charge-trapping dielectric layer in an upper portion of the first opening to cover the first dielectric layer;
    forming a second opening in the semiconductor substrate adjacent to the first opening;
    forming a gate electrode in a lower portion of the second opening;
    forming a doping region of a predetermined conductivity type in the semiconductor substrate adjacent to the first opening and the second opening, wherein the doping region of the predetermined conductivity type has a polarity which is different from that of the charges trapped in the charge-trapping dielectric layer; and
    forming a liner insulating layer between the lower portion of the first opening and the first dielectric layer and between the upper portion of the first opening and the charge-trapping dielectric layer.

11. The method of claim 10, wherein a bottom surface edge of the charge-trapping dielectric layer is lower than a top surface edge of the gate electrode.

12. The method of claim 10, wherein the predetermined conductivity type is n-type.

13. The method of claim 12, wherein the polarity of the charges trapped in the charge-trapping dielectric layer is positive.

14. The method of claim 12, wherein the charge-trapping dielectric layer comprises silicon nitride.

15. The method of claim 10, wherein the first dielectric layer comprises silicon oxide.

16. The method of claim 10, wherein the predetermined conductivity type is p-type.

17. The method of claim 16, wherein the polarity of the charges trapped in the charge-trapping dielectric layer is negative.

18. The method of claim 10, further comprising:
    forming a second dielectric layer in an upper portion of the second opening to cover the gate electrode; and
    forming a gate dielectric layer between the gate electrode and the doping region of the predetermined conductivity type.

* * * * *